United States Patent [19]
Iwata et al.

[11] Patent Number: 5,970,018
[45] Date of Patent: Oct. 19, 1999

[54] SEMICONDUCTOR INTEGRATED CIRCUIT AND DECODE CIRCUIT FOR MEMORY

[75] Inventors: Toru Iwata; Hironori Akamatsu, both of Osaka, Japan

[73] Assignee: Matsushita Electrical Industrial Co., Ltd., Osaka, Japan

[21] Appl. No.: 08/974,560

[22] Filed: Nov. 19, 1997

[30] Foreign Application Priority Data

Nov. 20, 1996 [JP] Japan ................................ 8-309041

[51] Int. Cl.⁶ ...................................................... G11C 8/00
[52] U.S. Cl. ...................... 365/230.06; 365/229; 326/105
[58] Field of Search ......................... 365/230.06, 230.03, 365/229; 326/105, 106, 108

[56] References Cited

U.S. PATENT DOCUMENTS 5,675,548  10/1997  Yokoyama et al. ................. 365/230.08
5,680,362  10/1997  Parris et al. ..................... 365/230.06 X
5,808,500   9/1998  Kalpakjian ....................... 365/230.06 X

FOREIGN PATENT DOCUMENTS 06029834  4/1994  Japan .

*Primary Examiner*—Huan Hoang
*Attorney, Agent, or Firm*—McDermott, Will & Emery

[57] ABSTRACT

In plural internal logic circuits, plural transistors having the same function are merged into a single merged transistor. This merged transistor is interposed between a ground and a virtual ground line connected with a ground node of an inverter included in each of the internal logic circuits, and has a threshold voltage higher than a threshold voltage of a transistor included in each inverter. The merged transistor is controlled in accordance with a block selecting signal. Since the merged transistor is merged among the internal logic circuits, its gate width can be set larger, resulting in attaining a high speed operation of each inverter. During a standby, a leakage current can be suppressed since the merged transistor is in an off-state. During an operation, a leakage current can be suppressed in an unselected circuit block since the merged transistor is in an off-state. Accordingly, while suppressing increase of the circuit area, the internal logic circuits can attain a high speed operation and a leakage current can be minimized during both a standby and an operation.

15 Claims, 13 Drawing Sheets

MERGED NMOS TRANSISTOR HAVING HIGH THRESHOLD VOLTAGE

MERGED NMOS TRANSISTOR HAVING HIGH THRESHOLD VOLTAGE

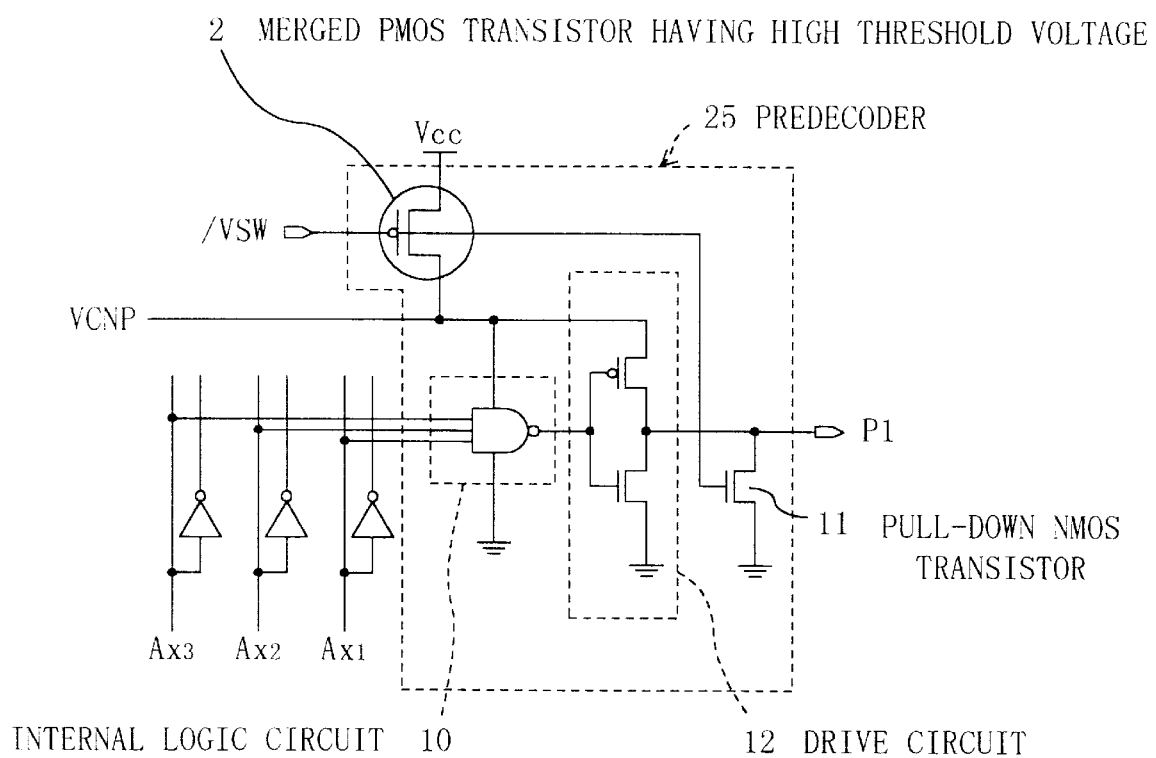

6  MERGED NMOS TRANSISTOR HAVING HIGH THRESHOLD VOLTAGE

6 MERGED NMOS TRANSISTOR HAVING HIGH THRESHOLD VOLTAGE

SEMICONDUCTOR INTEGRATED CIRCUIT AND DECODE CIRCUIT FOR MEMORY

BACKGROUND OF THE INVENTION

The present invention relates to improvement of a semiconductor integrated circuit, particularly, a decode circuit for use in a DRAM, a flash memory or the like. More particularly, it relates to operation speed increase and power consumption decrease in a logic circuit in which an input order of signals is previously determined.

In accordance with recent spread of portable equipment and in view of energy-saving, there are increasing demands for decrease of power consumption of LSIs. In order to decrease the power consumption, decrease of a supply voltage is effective. Moreover, in accordance with refinement of transistors, the decrease of a supply voltage has become indispensable in the design of LSIs for attaining reliability thereof. However, when the supply voltage is decreased, the driving ability of a transistor is degraded. As a result, necessary performance as an LSI cannot be attained. A driving current Id for a transistor is substantially obtained as follows:

$$Id = \beta \cdot (Vgs - Vt)^2$$

Therefore, as a threshold voltage Vt decreases, the driving ability of the transistor is improved. For example, in the case where the supply voltage is 1.0 V and a voltage of 1.0 V is applied as a gate-source voltage Vgs, the driving ability of the transistor can be substantially doubled by decreasing its threshold voltage Vt from 0.5 V to 0.3 V. However, when the threshold voltage is decreased, there is a possibility of a leakage current, and hence, the threshold voltage of the transistor included in a circuit cannot be simply decreased.

Accordingly, as a conventional method of attaining both a high operation speed and a small leakage current, an MTCMOS circuit has been proposed as disclosed in, for example, Japanese Laid-Open Patent Publication No. 6-29834. Now, application of this MTCMOS circuit to a decode circuit for a memory will be exemplified.

This decode circuit comprises a plurality of circuit blocks including a large number of logic circuits connected with one another in parallel. Each circuit block is connected with a power line through a P-type MOS transistor having a high threshold voltage, and is connected with a ground line through an N-type MOS transistor having a high threshold voltage. The respective P-type and N-type MOS transistors having the high threshold voltage in each circuit block are commonly controlled in accordance with two operation/standby switching signals complementary to each other.

Therefore, during a standby, the two MOS transistors having the high threshold voltage are in an off-state in accordance with the operation/standby switching signals in each circuit block, so that each circuit block can be disconnected from the power line and the ground line. Thus, a leakage path from the power line to the ground line through each circuit block can be effectively cut off by using the high threshold voltages of the MOS transistors, resulting in decreasing a leakage current. On the other hand, during an operation, the two MOS transistors having the high threshold voltages are in an on-state in accordance with the operation/standby switching signals in each circuit block, so that the power line and the ground line can be connected with each circuit block. Thus, the logic circuits in each circuit block can be operated. At this point, when the logic circuits in each circuit block include transistors having a low threshold voltage, each of the transistors has high driving ability owing to its low threshold voltage, and hence can be operated at a high speed. In this manner, both a high operation speed during an operation and a low leakage current during a standby can be attained.

In the conventional decode circuit, however, although a leakage current can be suppressed during a standby, both the P-type and N-type MOS transistors having the high threshold voltages are required. Therefore, the area of the resultant circuit is increased because these transistors are hierarchically inserted.

Furthermore, when the threshold voltage of the transistor having the high threshold voltage is set at an excessively large value for the purpose of decreasing a leakage current, the driving ability of the transistor having the high threshold voltage can be degraded. As a result, even when each of the transistors in the logic circuits has a low threshold voltage, the high speed operation performance of the logic circuits can be spoiled by the transistor having the high threshold voltage. Therefore, the high threshold voltages of the P-type and the N-type MOS transistors are set in a range where a low leakage current during a standby and a high speed operation of the circuit can be attained, and hence, excellent results cannot be expected in both objects.

Moreover, in the conventional decode circuit for a memory, when a predetermined one circuit block is selected during an operation, one of the logic circuits is selected in the selected circuit block, so that the output of the selected logic circuit is used as a decode signal. However, in each of the other plural circuit blocks (namely, unselected circuit blocks) excluding the selected circuit block including the selected logic circuit outputting the decode signal, the two MOS transistors having the high threshold voltage are in an on-state in accordance with the operation/standby switching signals. Therefore, the unselected circuit blocks are connected with the power line and the ground line, so as to form a leakage path in each of these unselected circuit blocks and allow a leakage current to flow. In this manner, the conventional decode circuit has a disadvantage of a large leakage current in the unselected circuit blocks during an operation.

SUMMARY OF THE INVENTION

The object of the invention is attaining, in a semiconductor integrated circuit, in particular, in a decode circuit for a memory, a high speed operation of a logic circuit, while suppressing circuit area increase, and minimizing a leakage current both during a standby and an operation.

In order to achieve the object, plural transistors having the same function are merged into a single transistor (namely, shared by circuit blocks) in this invention, so that the effective gate width of the merged transistor can be enlarged without increasing the circuit area. Thus, a high speed operation of the logic circuit can be attained. Furthermore, by setting the threshold voltage of the merged transistor at a high voltage, a leakage current during a standby can be decreased. In addition, the merged transistor is controlled in accordance with a block selecting signal, so that the merged transistor can be in an off-state in an unselected circuit block during an operation. Thus, a leakage current in the unselected circuit block can be suppressed during an operation.

Specifically, the semiconductor integrated circuit of this invention comprises a circuit block including plural logic circuits each having the same configuration and including plural transistors; and a switching circuit for connecting the plural logic circuits with a predetermined power supply, wherein the switching circuit includes a single merged transistor formed by merging a part of transistors having the same function of the plural logic circuits, and the merged transistor of the switching circuit has a threshold voltage higher than a threshold voltage of another transistor included in each of the logic circuits, and receives, at a gate thereof, a block selecting signal for selecting the circuit block.

Moreover, the decode circuit for a memory of this invention comprises a predecoder for predecoding a part of address signals of plural bits and outputting a predecoded signal as a block selecting signal; and plural circuit blocks to be selected in accordance with the block selecting signal of the predecoder, wherein each of the circuit blocks includes plural logic circuits, each having the same configuration and including plural transistors, for decoding remaining address signals which are not predecoded by the predecoder when the circuit block is selected; and a switching circuit for connecting the plural logic circuits with a predetermined power supply, the switching circuit includes a single merged transistor formed by merging transistors having the same function of the plural logic circuits, and the merged transistor of the switching circuit has a threshold voltage higher than a threshold voltage of another transistor included in each of the logic circuits and receives, at a gate thereof, the block selecting signal of the predecoder.

Owing to the aforementioned configuration, in the semiconductor integrated circuit and the decode circuit for a memory of this invention, a leakage path in a circuit block can be definitely cut off during a standby by the switching circuit having the high threshold voltage: As a result, a leakage current during a standby can be decreased, and energy can be saved.

Furthermore, the switching circuit having the high threshold voltage includes the single merged transistor formed by merging the transistors having the same function and included in plural NAND or NOR circuits, and the gate width of the merged transistor can be set at a large value. Therefore, a current flowing from the circuit block to the ground power supply or a current flowing into the circuit block from the predetermined power supply can be increased, so that the high speed operation performance of the logic circuit including the transistors having the low threshold voltage can be improved.

In addition, although the decode circuit for a memory is divided into plural circuit blocks, when a predetermined circuit block is selected during an operation, the switching circuit having the high threshold voltage is in an off-state in each of the remaining many unselected circuit blocks. Therefore, a leakage current can be minimized in each of the unselected circuit blocks, resulting in decreasing a leakage current during an operation. Thus, the energy can be more effectively saved.

BRIEF DESCRIPTION OF THE DRAWINGS

FIG. 3 is a diagram for showing the inside configuration of a predecoder included in the decode circuit for the memory of FIG. 1;

DETAILED DESCRIPTION OF THE INVENTION

Now, preferred embodiments of the invention will be described with reference to the accompanying drawings.

Embodiment 1

Figure 1:
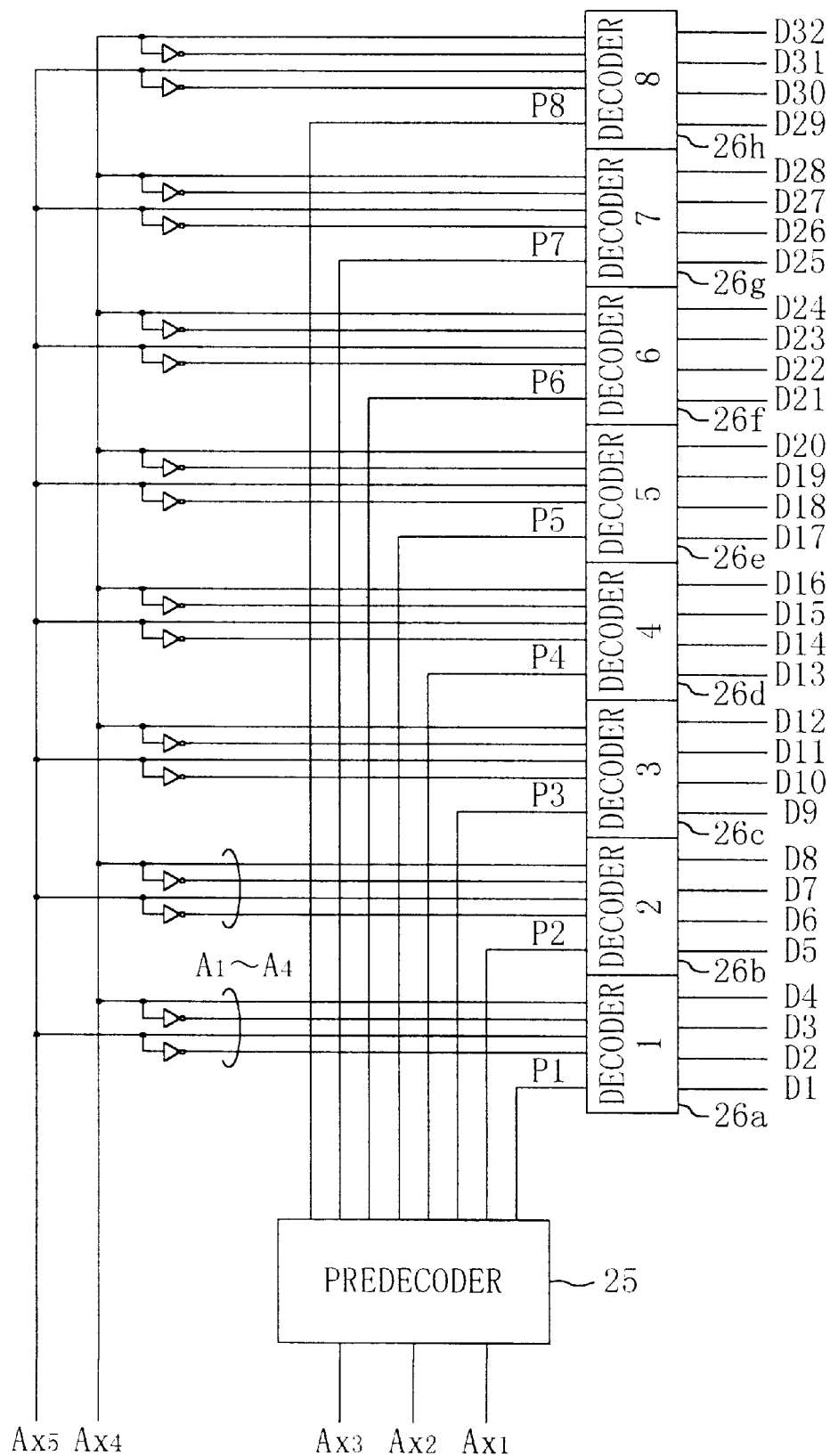
FIG. 1 is a diagram for showing the entire configuration of a decode circuit for a memory according to a first embodiment of the invention.
Figure 2A:
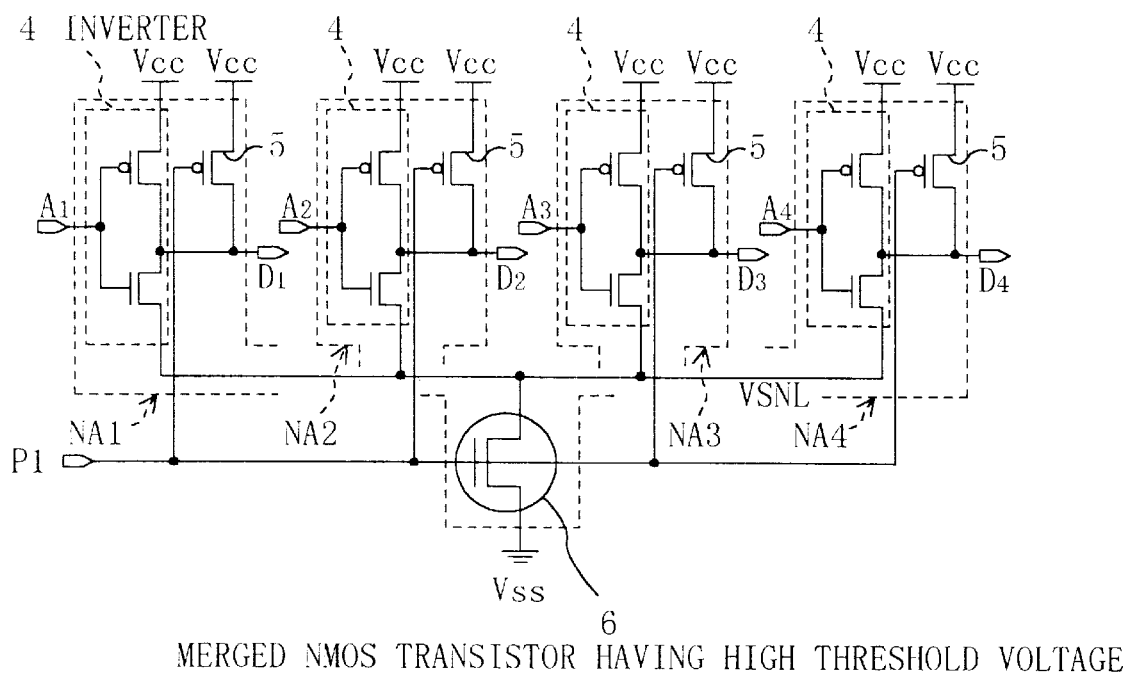
FIG. 2(a) is a diagram for showing the inside configuration of a circuit block included in the decode circuit for a memory of FIG. 1
Figure 2B:
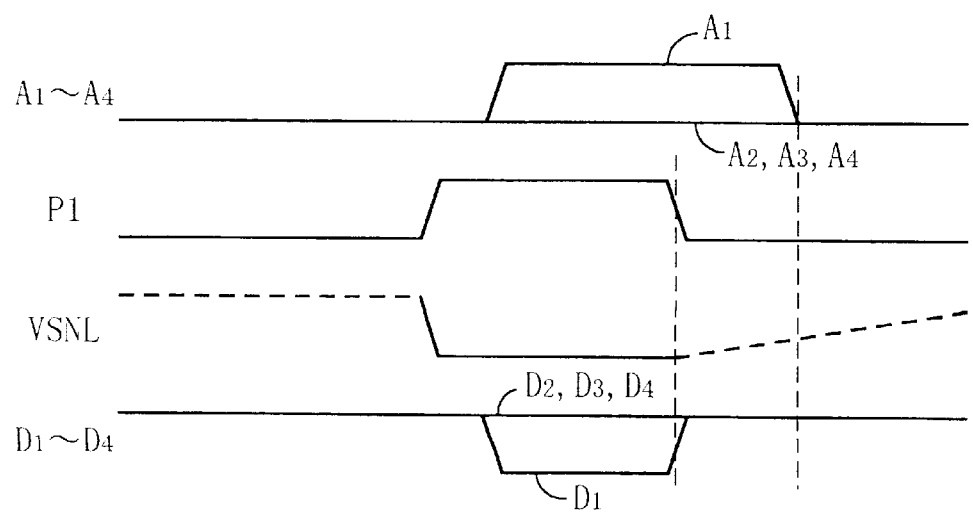
FIG. 2(b) is a diagram for showing an operation waveform of the circuit block of FIG. 2(a)

FIGS. 1, 2(a) and 2(b) illustrate a decode circuit for a memory according to a first embodiment of the invention.

FIG. 1 shows the entire configuration of the decode circuit for a DRAM (dynamic random access memory), which is a circuit for decoding data of five bits (address signals) A×1 through A×5 into 32 (i.e., $2^5$) signals D1 through D32.

In FIG. 1, a reference numeral 25 denotes a predecoder (predecoder) for receiving the address signals A×1, A×2 and A×3, corresponding to the lower three bits of the address signals A×1 through A×5 of five bits, and generating eight predecode signals P1 through P8. Reference numerals 26a through 26h denote 8 decoders (circuit blocks), each of which receives one corresponding predecode signal among the predecode signals P1 through P8 from the predecoder 25 as an activating signal (block selecting signal) and also receives the address signals A×4 and A×5, that is, the remaining upper two bits, and inverted signals of these address signals as address signals A1 through A4, so as to decode the address signals A1 through A4 into four data and output the decoded four signals. In this manner, the 8 circuit blocks 26a through 26h output the 32 decode signals D1 through D32 in total.

The eight circuit blocks (decoders) 26a through 26h have the same inside configuration. FIG. 2(a) shows the inside configuration of the circuit block 26a, and illustrates an embodiment of what is claimed in claim 5.

In FIG. 2(a), NA1 through NA4 indicate 4 NAND circuits. In each of the NAND circuits, a reference numeral 4 denotes an inverter (logic circuit) including transistors with a low threshold voltage, and a reference numeral 5 denotes a PMOS transistor for pulling up output node D1, D2, D3 or D4 of the inverter 4.

A reference numeral 6 denotes an NMOS transistor merged among and shared by the four NAND circuits NA1 through NA4. VSNL indicates a virtual ground line, with which the node with a lower potential of the inverter 4 is connected. The NMOS transistor (switching circuit) 6 is interposed between the virtual ground line VSNL and a ground power supply Vss, and has a threshold voltage higher than that of an NMOS transistor included in each inverter 4. The NMOS transistor 6 having the high threshold voltage receives the predecode signal (block selecting signal) P1 at its gate and functions as a switching circuit for connecting the four inverters 4 with the ground power supply Vss through the virtual ground line VSNL when the predecode signal (block selecting signal) P1 is input (i.e., the signal is at a high level).

The PMOS pull-up transistor 5 receives the block selecting signal P1 at its gate, and is turned on when the block selecting signal P1 is not input (i.e., the signal is at a low level), so as to connect the output node D1, D2, D3 or D4 of the corresponding NAND circuit with a predetermined power supply Vcc and pull up the output node D1, D2, D3 or D4 to a power supply potential.

FIG. 2(b) a timing chart for respective signals in the decoder of FIG. 2(a), and the operation of the decoder will now be described in accordance with these signals.

First, a state immediately after starting the operation will be described. The block selecting signal P1 and the address signals A1 through A4 are all at a low level. Accordingly, the NMOS transistor 6 having the high threshold voltage is in an off-state, so as to disconnected the virtual ground line VSNL from the ground power supply Vss, and the pull-up PMOS transistors 5 are in an on-state, so that the output nodes D1 through D4 of all the inverters 4 can be connected with the predetermined power supplies Vcc to be fixed at a high potential and have high noise resistance. At this point, the virtual ground line VSNL is placed in a floating state by the NMOS transistor 6 in an off-state, but never affects the operation of the decoder because the NMOS transistors in the respective inverters 4 are in an off-state.

In the case where the decoder (circuit block) 26a is to be selected, the predecode signal P1 undergoes a low to high transition first. As a result, the NMOS transistor 6 having the high threshold voltage is turned on, thereby connecting the virtual ground line VSNL with the ground power supply Vss. At this point, the pull-up PMOS transistors 5 are turned off, so that the power supply potential Vcc or the ground potential Vss can be applied to the output nodes D1 through D4 of the inverters 4 in accordance with the address signals A1 through A4. When the address signals A1 through A4 are then activated and one of them undergoes a low to high transition, the corresponding inverter 4 outputs a low output and the remaining inverters 4 keep on outputting a high output.

Thereafter, when the block selecting signal P1 undergoes a high to low transition, the NMOS transistor 6 having the high threshold voltage is turned off, so as to disconnect the virtual ground line VSNL from the ground power supply Vss, and the pull-up PMOS transistors 5 are turned on at the same time. Accordingly, even when the inverters 4 are supplied with signals at a high level, the outputs of the inverters 4 are fixed at a high level, so that all the inverters 4 can output high outputs.

In the case where the address signals A1 through A4 are reset prior to the block selecting signal P1, or in the case where the same circuit block is to be selected again, i.e., in the case where the block selecting signal P1 does not undergo a high to low transition, merely one inverter 4 corresponding to the address selected in accordance with the address signals A1 through A4 is normally operated as an inverter, and hence, the decoder can be correctly operated.

Now, the decode circuit of this embodiment will be compared with the conventional decode circuit. In this embodiment, the function of each NAND circuit is realized by the inverter 4 and the pull-up transistor 5, which are provided to each NAND circuit, and the NMOS transistor 6 having the high threshold voltage, which is merged among all the NAND circuits. Therefore, as compared with the case where the four NAND circuits included in a circuit block respectively include transistors each having the same function as the NMOS transistor 6, the layout area can be suppressed from increasing in this embodiment.

Also, since the single NMOS transistor 6 having the high threshold voltage is used as four transistors having the same function, the gate width of the NMOS transistor 6 having the high threshold voltage can be set to be four times as large as the gate width of each of the four transistors used in stead of the NMOS transistor 6. Therefore, even through the NMOS transistor 6 has the high threshold voltage, the driving ability can be sufficiently guaranteed. For example, when the supply voltage is 1.0 V, a transistor having a threshold voltage of 0.5 V has driving ability a half as large as that of a transistor having a threshold voltage of 0.3 V. However, when the gate width of the transistor having the threshold voltage of 0.5 V is doubled, this transistor can attain a driving current at the same level as the transistor having the threshold voltage of 0.3 V. Therefore, when a decoder includes a transistor having a low threshold voltage (0.3 V) and a transistor having a high threshold voltage (0.5 V), the driving ability of the decoder can be improved without increasing the circuit area as far as the number n of the NAND circuits is two or more.

When at least one transistor (switching circuit) 6 having a high threshold voltage is disposed on a leakage path from the predetermined power supply Vcc to the ground power supply Vss, a leakage current can be actually cut off. Therefore, the leakage path of the circuit block 26a is cut off by the NMOS transistor 6 having the high threshold voltage alone in this embodiment. Accordingly, there is no need to dispose a PMOS transistor having a high threshold voltage, serving as a transistor having a high threshold voltage required for an MTCMOS circuit configuration, between the predetermined power supply Vcc and the decoder 26a. Thus, the effect to decrease the circuit area of the entire decode circuit can be further remarkable in this embodiment.

Figure 4:
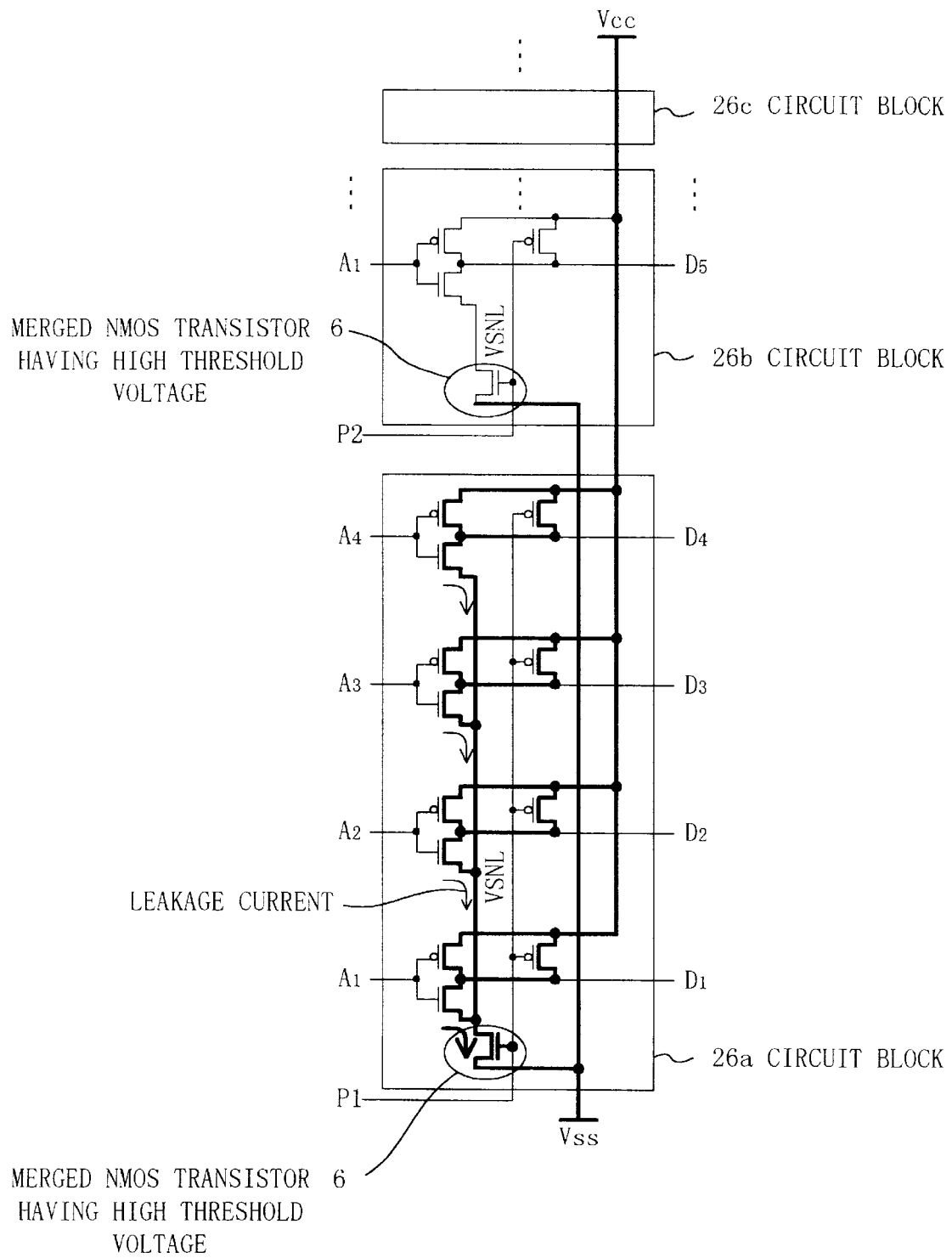
FIG. 4 is a diagram for showing a leakage current path in the decode circuit for a memory of FIG. 1.

Furthermore, when one predetermined circuit block 26a is selected during an operation, the NMOS transistor 6 having the high threshold voltage is turned on in accordance with the block selecting signal P1, and hence, a leakage path is formed from the ground node of each inverter 4 to the ground power supply Vss through the virtual ground line VSNL as is shown in FIG. 4. However, in each of the other unselected circuit blocks 26b through 26h, the NMOS transistor 6 having the high threshold voltage is in an off-state in accordance with the block selecting signals P2 through P8. Therefore, the leakage path from the ground node of each inverter 4 to the ground power supply Vss through the virtual ground line VSNL can be effectively cut off in these unselected circuit blocks. As a result, a leakage current in each of the unselected circuit blocks 26b through 26d can be suppressed during an operation.

Figure 5:
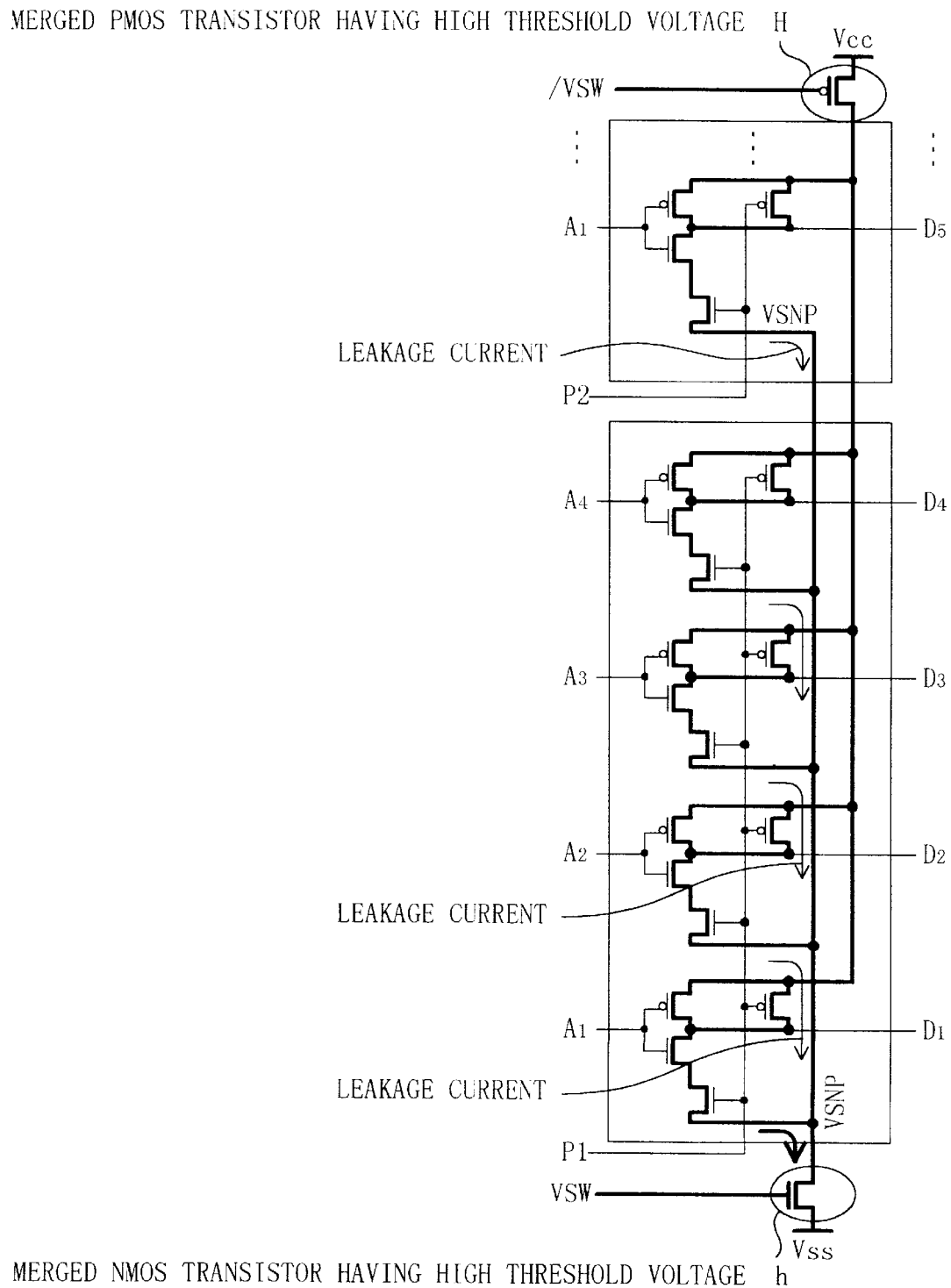
FIG. 5 is a diagram for showing a leakage current path in a conventional decode circuit for a memory.

In contrast, in the conventional decode circuit of FIG. 5, NMOS transistors H and h having the high threshold voltage are in an on-state in accordance with complementary operation/standby switching signals /VSW and VSW during an operation. Therefore, in each of the other unselected circuit blocks, a leakage path is formed from the ground node of each inverter 4 to the ground power supply Vss through a virtual ground line VSNP and the NMOS transistor h having the high threshold voltage. Thus, the conventional decode circuit has a disadvantage of an increased leakage current.

In this embodiment, the decode circuit for a memory is described, but it goes without saying that the configuration of this embodiment is directly applicable to plural NAND circuits in which a commonly input signal precedes other signals.

Moreover, in this embodiment, the operation to set the signals is described in assuming that the block selecting signal P1 for controlling the NMOS transistor 6 having the high threshold voltage and the pull-up PMOS transistors 5 is precedently input. However, in the case where the address signals A1 through A4 for controlling the inverters 4 are precedently input, the inverters 4 cannot be operated until the block selecting signal P1 undergoes a low to high transition because the outputs of the inverters 4 are fixed at the supply potential Vcc by the pull-up transistors 5 and the virtual ground line VSNP of the inverters 4 is at a high impedance. However, when the inverter 4 is actuated by such a transition of the block selecting signal P1, the switching speed of the NMOS transistor 6 having the high threshold voltage can cause a problem because of the high threshold voltage and the large size of the NMOS transistor 6. Specifically, the operation speed can be degraded as compared with the case where the block selecting signal P1 is precedently input and the inverter 4 is actuated thereafter by inputting a signal for directly controlling the gate thereof. Accordingly, it is preferred that the block selecting signal P1 for controlling the NMOS transistor 6 having the high threshold voltage and the pull-up PMOS transistors 5 is precedently input.

In addition, plural two-input NAND circuits are used in this embodiment, but this embodiment is applicable to usage of multi-input NAND circuits. For example, when a NAND circuit has n inputs, the inverter 4 is replaced with a NAND circuit with (n−1) inputs. Nodes with a lower potential of the (n−1)-input NAND circuits consisting of transistors having a low threshold voltage are commonly connected, and an NMOS transistor having a high threshold voltage is interposed between this common node and the ground power supply Vss. Furthermore, a transistor for pulling up the output of each (n−1)-input NAND circuit is provided, so that the NMOS transistor having the high threshold voltage and the pull-up transistors can be controlled by a preceding signal as in the case of the usage of the two-input NAND circuits. Thus, the operation speed can be improved as well as a leakage current can be decreased.

Next, the inside configuration of the predecoder 25 of FIG. 1 will be described. This predecoder 25, corresponding to an embodiment of what is claimed in claim 12, has a specific configuration for the following reason: In cutting off the leakage path by providing the transistor 6 having the high threshold voltage, a signal for controlling the transistor 6 having the high threshold voltage is the block selecting signal (predecode signal) P1, and this signal is not directly externally input but generated by a logic circuit included in the predecoder. On the other hand, even when the conventional MTCMOS circuit is adopted as the means for attaining a high operation speed and a low leakage current in the logic circuit operated at a low driving voltage, the output of the logic circuit during a standby can be slightly shifted from an expected value of the supply potential Vcc or the ground potential Vss due to current leakage. Accordingly, even when the output of the logic circuit (i.e., the block selecting signal) is input to the transistor 6 having the high threshold voltage during a standby, the transistor 6 cannot be definitely turned off, and hence, the leakage path cannot be definitely cut off. Thus, there is a possibility of increase of a leakage current. The predecoder 25 of FIG. 1 works for retaining the output of the logic circuit at the expected value of the ground potential Vss so that the transistor 6 having the high threshold voltage can be definitely turned off during a standby. The inside configuration of the predecoder 25 is shown in FIG. 3.

The predecoder 25 of FIG. 3 is a circuit for outputting the block selecting signal P1 at a low level during a standby. In FIG. 3, a reference numeral 10 denotes an internal logic circuit for receiving the address signals A×1 through A×3 corresponding to the lower three bits, a reference numeral 12 denotes a drive circuit including an inverter consisting of two transistors. The internal logic circuit 10 and the drive circuit 12 are disposed between a power line VCNP and a ground. As a transistor included in the internal logic circuit 10 and the drive circuit 12, a transistor having a low threshold voltage is used for attaining a high operation speed at a low driving voltage. The power line VCNP is connected with a predetermined power supply Vcc through a PMOS transistor 2 having a high threshold voltage. The PMOS transistor 2 having the high threshold voltage is supplied, at its gate, with an inverted signal (control signal) /VSW (which is at a high level during a standby) of an operation/standby switching signal VSW. The inverted signal /VSW is externally input or input from a dedicated control circuit.

The drive circuit 12 inverts the output of the internal logic circuit 10, and outputs the inverted signal from its output terminal as the block selecting signal P1. Between the output terminal of the drive circuit 12 and the ground, a pull-down NMOS transistor 11 controlled in accordance with the inverted signal /VSW of the operation/standby switching signal is interposed.

Now, the operation of the predecoder 25 of FIG. 3 will be described. During a standby, the internal logic circuit 10 outputs a high output, and this high output is inverted by the drive circuit 12, so as to output the block selecting signal P1 at a low level. During this standby, the PMOS transistor 2 having the high threshold voltage is turned off in accordance with the inverted signal /VSW at a high level of the operation/standby switching signal, so as to disconnect the power line VCNP from the predetermined power supply Vcc and cut off a leakage current from the predetermined power supply Vcc to the internal logic circuit 10. At this point, the power line VCNP is placed in a floating state, and hence, the potential of the power line VCNP is decreased due to a leakage current from the internal logic circuit 10 to the ground. When the potential of the power line VCNP is further decreased, a potential difference required for the operation of the circuit cannot be obtained. Therefore, the output of the drive circuit 12 changes to attain a high impedance, and the pull-down NMOS transistor 11 is turned on in accordance with the inverted signal /VSW at a high level, so as to ground the output terminal and fix the block selecting signal P1 at a low level. In this manner, while the transistor having a low threshold voltage is included in the internal logic circuit 10, the block selecting signal P1 can be definitely retained at a low level during a standby.

There can arise a case, during a standby, where the drive circuit 12 outputs a high output due to a noise or the like, but a current path formed in such a case is a path from the power line VCNP in a floating state through the drive circuit 12 and the pull-down NMOS transistor 11 to the ground, and hence, a current actually does not flow.

First Modification of Circuit Block

Figure 6A:
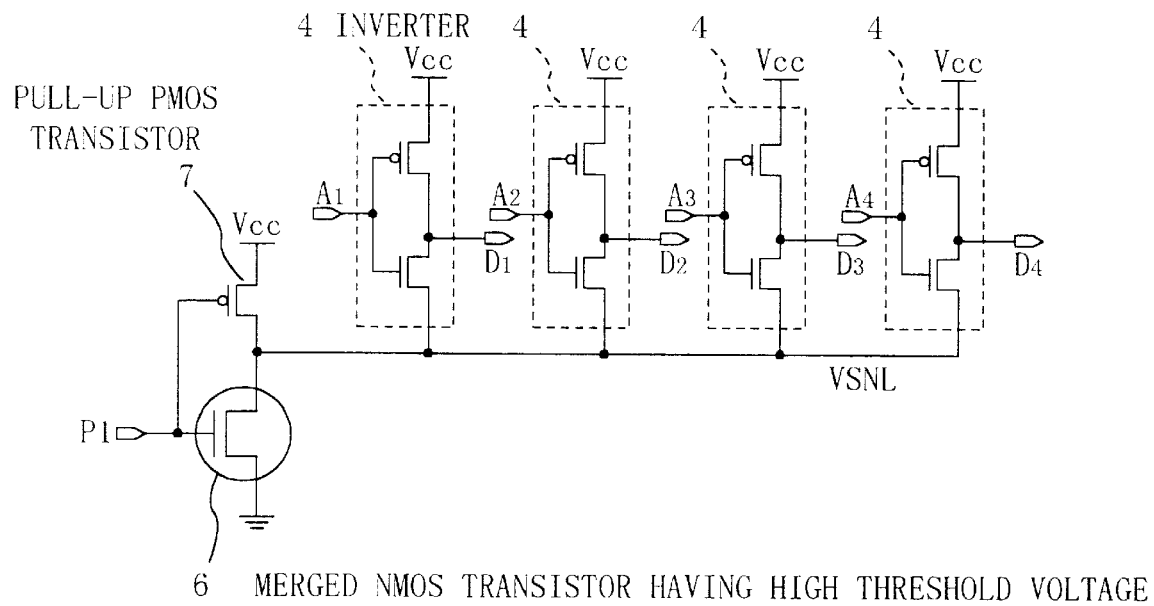
FIG. 6(a) is a diagram for showing a first modification of the circuit block and FIG. 6(b) is a diagram for showing an operation waveform of the circuit block of FIG. 6(a)

FIG. 6(a) shows a first modification of each of the circuit blocks 26a through 26h described in the first embodiment, and illustrates an embodiment of what is claimed in claim 6.

In this modification, as is obvious from comparison between FIGS. 6(a) and 2(a), the PMOS pull-up transistors 5 of the respective NAND circuits NA1 through NA4 of FIG. 2(a) are eliminated with a single PMOS transistor 7 interposed between a predetermined power supply Vcc and a ground node of the inverter 4. In other words, the function of each NAND circuit is realized in this modification by the inverter 4 including the transistors with a low threshold voltage and provided to each NAND circuit, the merged NMOS transistor 6 having the high threshold voltage and the merged single PMOS transistor 7. The merged NMOS transistor 6 having the high threshold voltage and the merged single PMOS transistor 7 together function, as is understood from FIG. 6(a), as an inverter for controlling the virtual ground line VSNL.

Figure 6B:
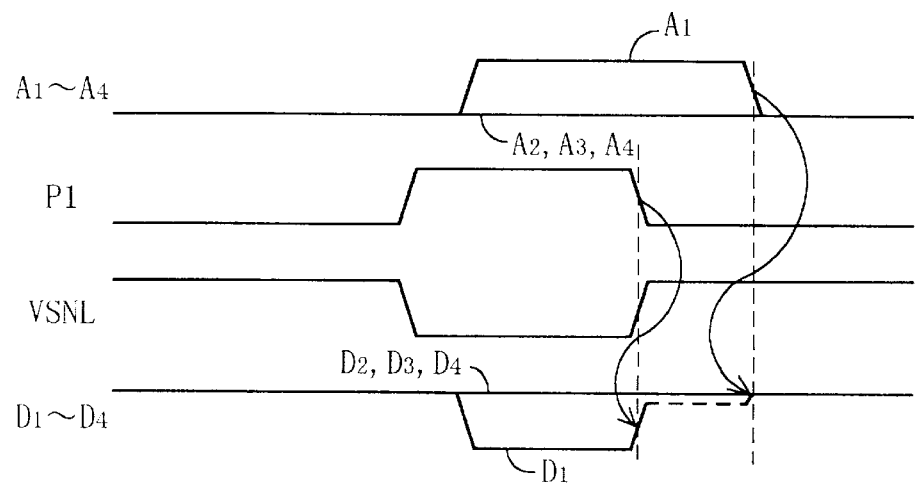

Next, the operation of the decoder of this modification will be described with reference to a timing chart shown in FIG. 6(b). Immediately after starting the operation, the block selecting signal P1 and all the address signals A1 through A4 are at a low level, and the output nodes D1 through D4 of all the inverters 4 are at a high level. At this point, the virtual ground line VSNL is charged with the supply potential Vcc by the PMOS transistor 7.

Since the PMOS transistor 7 is in an on-state during a standby, its threshold voltage is not required to be high.

In the case where the circuit block 26a is to be selected, the block selecting signal P1 undergoes a low to high transition first, and the PMOS transistor 7 is turned on. Simultaneously, the NMOS transistor 6 having the high threshold voltage is turned on, so as to charge the virtual ground line VSNL with the ground potential Vss. Then, the address signals A1 through A4 are activated and one of them undergoes a low to high transition, and hence, the corresponding inverter 4 outputs a low output. The remaining inverters 4 keep on outputting a high output.

When the address is changed and the block selecting signal P1 undergoes a high to low transition, the NMOS transistor 6 having the high threshold voltage is turned off, and the PMOS transistor 7 is turned on, so that the virtual ground line VSNL can be supplied with the supply power potential Vcc. Even though the block selecting signal P1 is reset, the inverters 4, to which high data is input, is placed in a high impedance state when the output voltage is increased to some extent. Since the NMOS transistor included in the inverter 4 is operated as a source follower, the output voltage is increased merely to a voltage (Vcc−Vt) (wherein Vt indicates the threshold voltage), and in particular, during an operation at a low driving voltage, the NMOS transistor is not immediately reset. After the reset of block selecting signal P1, the address signals A1 through A4 are reset to a low level, and then, the inverter 4 correctly outputs a high output and the reset is completed. After the reset, as in the circuit block of FIG. 2(a), the virtual ground line VSNL is disconnected from the ground power supply Vss by the transistor 6 having the high threshold voltage, and thus, the leakage path can be cut off.

In this manner, the circuit configuration shown in FIG. 6(a) has a disadvantage that the reset operation is effectively delayed, but is practically used in a circuit where the setting speed is significant but the resetting speed is negligible.

Needless to say, the circuit configuration of FIG. 6(a) has an advantage of a further decreased circuit area as compared with that of FIG. 2(a) because the plural pull-up PMOS transistors 5 are replaced with the single PMOS transistor 7.

It goes without saying that the two-input NAND circuits can be replaced with multi-input NAND circuits also in this modification.

Second Modification of Circuit Block

Figure 7A:
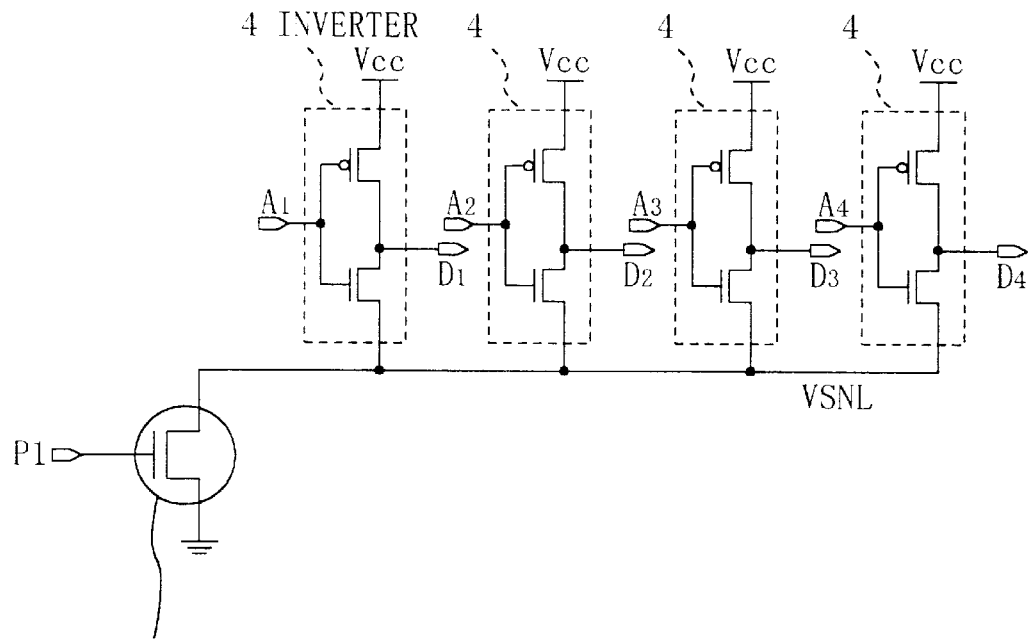
FIG. 7(a) is a diagram for showing a second modification of the circuit block and FIG. 7(b) is a diagram for showing an operation waveform of the circuit block of FIG. 7(a)

FIG. 7(a) shows a second modification of the circuit block of the first embodiment.

This modification corresponds to an embodiment of what is claimed in claim 7, and as is obvious from comparison between FIGS. 7(a) and 6(a), the single merged PMOS transistor of FIG. 6(a) is eliminated in this modification. Specifically, in this modification, the function of each NAND circuit is realized by the inverter 4 including the transistors having a low threshold voltage and provided to each NAND circuit, and the merged NMOS transistor 6 having the high threshold voltage for connecting the virtual ground line VSNL with the ground power supply Vss.

Figure 7B:
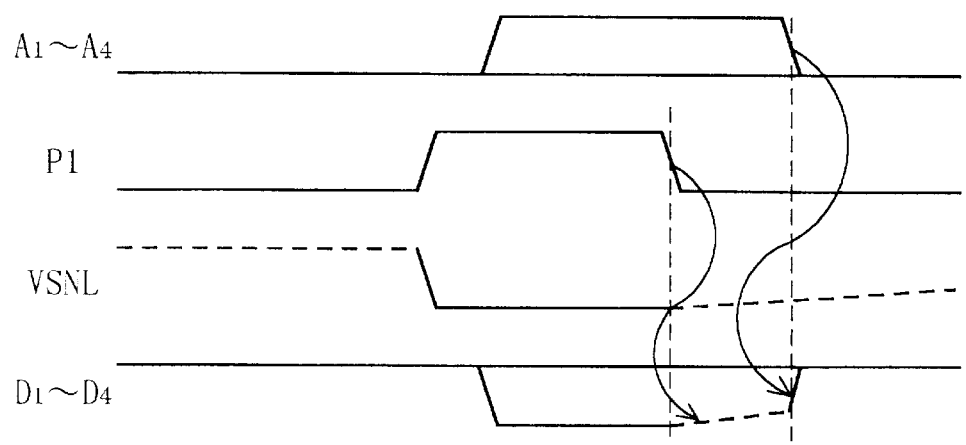

Now, the operation of the circuit block of this modification will be described with reference to a timing chart of FIG. 7(b). Immediately after starting the operation, as in the first modification, the NMOS transistor 6 having the high threshold voltage is in an off-state, and hence, the virtual ground line VSNL is in a high impedance state. Accordingly, when any of the signals A1 through A4 input to the respective inverters 4 undergoes a low to high transition precedently to the block selecting signal P1, the high output of the corresponding inverter 4 and the virtual ground line VSNL at a high impedance are short-circuited. When the potential held by the virtual ground line VSNL is low, the output potential of the inverter 4 is decreased, resulting in causing a malfunction.

On the other hand, when the transition of the block selecting signal P1 obviously precedes that of the signals A1 through A4, the virtual ground line VSNL is charged with the ground potential Vss in accordance with the block selecting signal P1, and then, one of the address signals A1 through A4 at a high level is properly input to the corresponding inverter 4, and the selected inverter 4 alone outputs a low output.

With regard to the reset operation, as in the circuit block of FIG. 6(a), when the inverter 4 is reset in accordance with the block selecting signal P1, the virtual ground line VSNL simply attains a high impedance, and hence, the output of the inverter 4 once attains a high impedance. Subsequently, the address signals are reset to a low level, and then, the inverter 4 is correctly reset and outputs a high output. This circuit configuration can be practical in application to a circuit where the resetting speed is negligible as described above.

Also, in the case where any of the address signals input to the inverters 4 undergoes a low to high transition prior to the block selecting signal P1, the output potential of the corresponding inverter 4 is decreased when the potential held by the virtual ground line VSNL is low as described above. The operation speed can be increased by making use of this. Specifically, when any of the address signals A1 through A4 undergoes a low to high transition prior to the block selecting signal P1, the virtual ground line VSNL and the output node D1, D2, D3 or D4 of the inverter 4 are connected with each other. The potentials of the virtual ground line VSNL and the output nodes D1 through D4 of the inverters 4 are determined in accordance with capacitance ratios of these nodes. When the potential of the output node D1, D2, D3 or D4 of the inverter 4 is decreased to a limit value not exceeding the logical threshold voltage of the circuit at the subsequent stage, simultaneously with the block selecting signal P1 undergoing a low to high transition and the NMOS transistor 6 having the high threshold voltage being turned on, the potential of the output node D1, D2, D3 or D4 of the inverter 4 starts to be decreased, and transition in the circuit at the subsequent stage is started.

In the above description, the NMOS transistor 6 having the high threshold voltage is directly interposed between the virtual ground line VSNL and the ground power supply Vss. However, when another NMOS transistor having a high threshold voltage, which is in an off-state merely during a standby, is further interposed between the NMOS transistor 6 and the ground power supply Vss and the threshold voltage of the NMOS transistor 6 is set to be low, a transistor having a large gate width can be used as the NMOS transistor 6 without increasing the circuit area as described above. Thus, a high operation speed and a low leakage current can be both attained without increasing the layout area.

Third Modification of Circuit Block

Figure 8A:
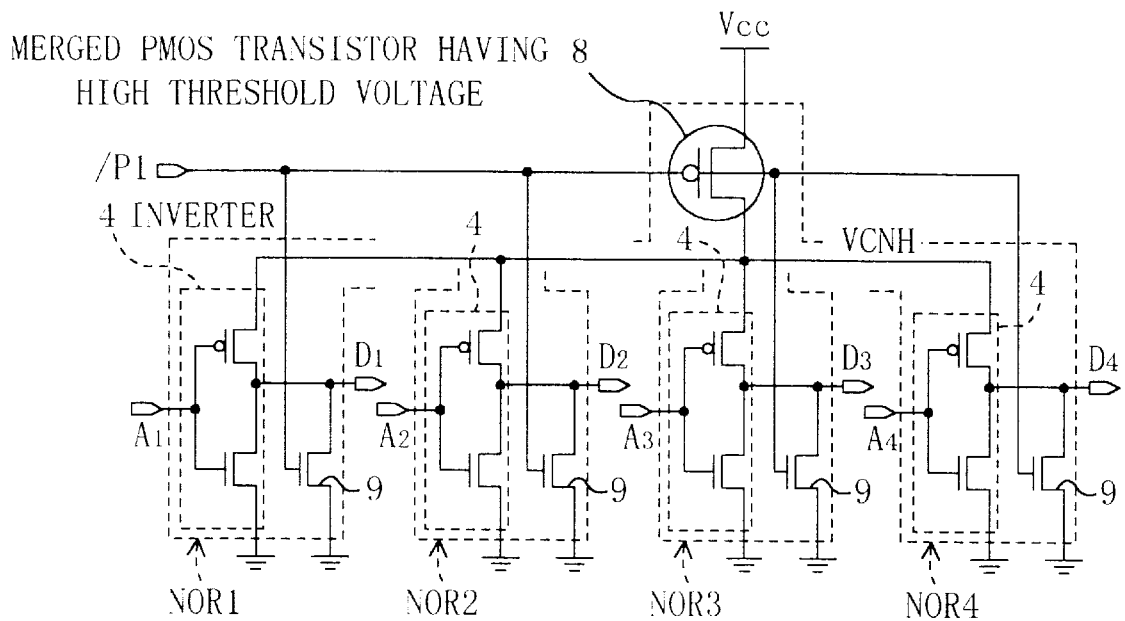
FIG. 8(a) is a diagram for showing a third modification of the circuit block and FIG. 8(b) is a diagram for showing an operation waveform of the circuit block of FIG. 8(a)

In the first embodiment and the first and second modifications, each of the circuit blocks (decoders) 26a through 26h includes the four NAND circuits NA1 through NA4. In this modification, the four NAND circuits are replaced with four NOR circuits. FIG. 8(a) shows a circuit block according to the third modification and illustrates an embodiment of what is claimed in claim 8. In the circuit block of FIG. 8(a), the conductivity types of the transistors and the direction of applying the voltages are reversed as compared with in the circuit block having the NAND function shown in FIG. 2(a). Specifically, in each of the four NOR circuits NOR1 through NOR4 of FIG. 8(a), a reference numeral 4 denotes an inverter (logic circuit) including transistors having a low threshold voltage, which is connected with a virtual power line VCNH at its node having a higher potential. A PMOS transistor (switching circuit) 8 merged among and shared by the four NOR circuits NOR1 through NOR4 is disposed between the virtual power line VCNH and a predetermined power supply Vcc, and has a threshold voltage higher than the threshold voltage of a PMOS transistor included in the inverter 4. An inverted signal /P1 of the predecode signal (block selecting signal) P1 is input to the gate of the merged PMOS transistor 8 and the gate of each of four NMOS transistors 9 for pulling down the output nodes D1 through D4 of the inverters 4.

Figure 8B:
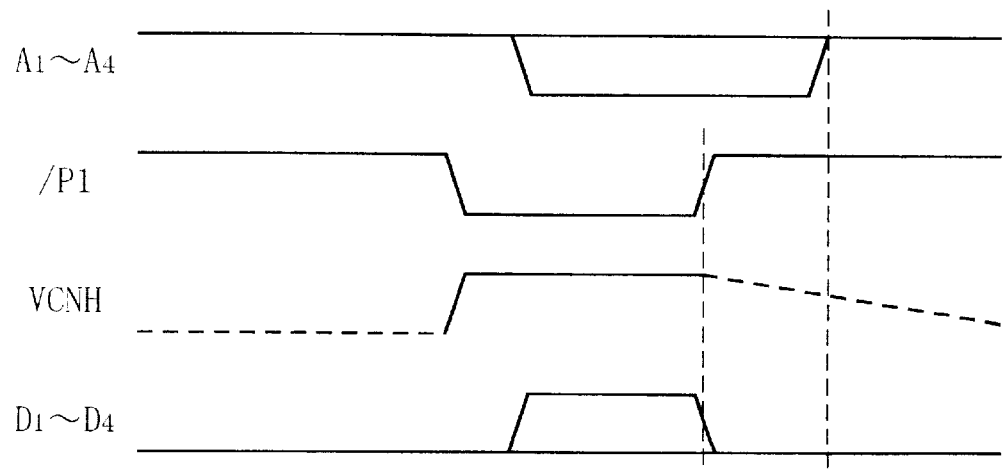

FIG. 8(b) shows a timing chart for respective signals used in this modification, and the operation of the circuit block of this modification will be described with reference to this timing chart.

A state immediately after starting an operation will be first described. The inverted signal /P1 of the block selecting signal and all the address signals A1 through A4 are at a high level, and the output nodes D1 through D4 of all the inverters 4 are at a low level. At this point, the merged PMOS transistor 8 is in an off-state, and the virtual power line VCNH is in a floating state, but the operation of the circuit block is never affected because the PMOS transistors of the inverters 4 are in an off-state.

In the case where the circuit block 26a is to be selected, the inverted signal /P1 of the block selecting signal under-goes a high to low transition, and the merged PMOS transistor 8 having the high threshold voltage is turned on, so as to connect the virtual power line VCNH with the predetermined power supply Vcc. At this point, the pull-down NMOS transistors 9 are turned off. Subsequently, when the address signals A1 through A4 are activated and one of them undergoes a high to low transition, the corresponding inverter 4 outputs a high output and the remaining inverters 4 keep on outputting a low output.

When the signals A×1 through A×5 are switched and the inverted signal /P1 of the block selecting signal undergoes a low to high transition, the PMOS transistor 8 having the high threshold voltage is turned off, so as to disconnect the virtual power line VCNH from the predetermined power supply Vcc. Simultaneously, the pull-down NMOS transistor 9 is turned on, and hence, even through the address signal at a low level is input to the inverter 4, the output of the inverter 4 is at a low level, and all the inverters 4 output a low output. In the case where the address signals A1 through A4 are reset prior to the inverted signal /P1 of the block selecting signal, or in the case where the inverted signal /P1 of the block selecting signal does not undergo a low to high transition for selecting the same circuit block, the inverter 4 corresponding to the address selected in accordance with the address signals A1 through A4 is normally operated as an inverter, and hence, the decoder is correctly operated.

In this manner, in the decoder using the NOR function, merely the conductivity types of the transistors and the direction of applying the voltages are reversed as compared with in the decoder using the NAND function, and can be similarly realized. It goes without saying that not only a two-input NOR circuit but also a multi-input NOR circuit is adoptable. For example, in using a function of an n-input NOR circuit, the inverter 4 is replaced with an (n−1)-input NOR circuit.

Fourth Modification of Circuit Block

Figure 9A:
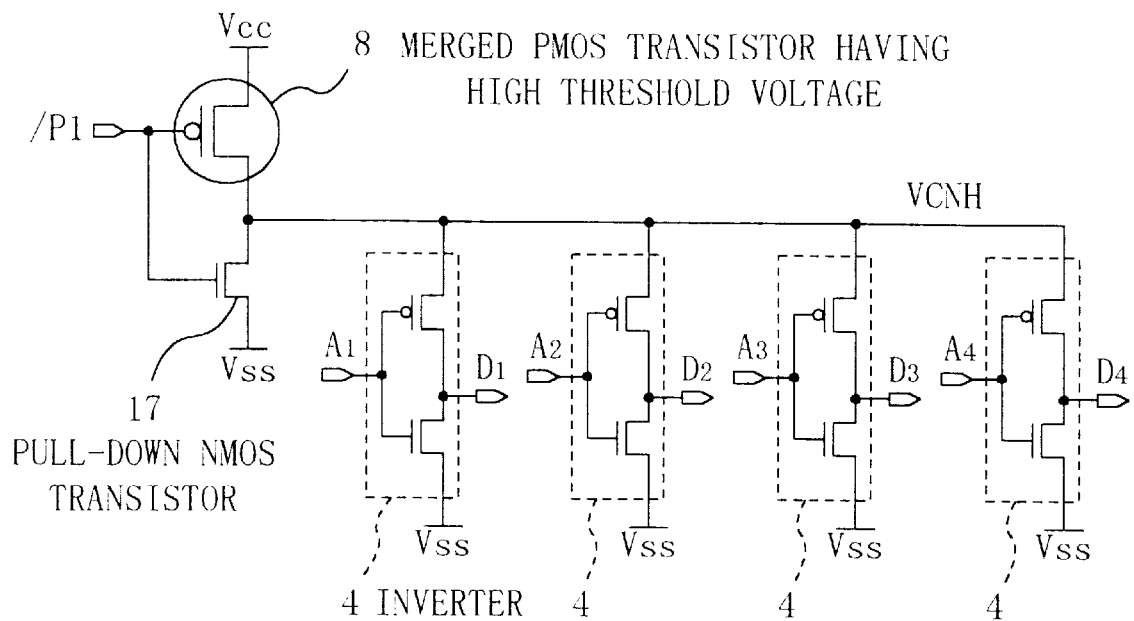
FIG. 9(a) is a diagram for showing a fourth modification of the circuit block and FIG. 9(b) is a diagram for showing an operation waveform of the circuit block of FIG. 9(a)
Figure 9B:
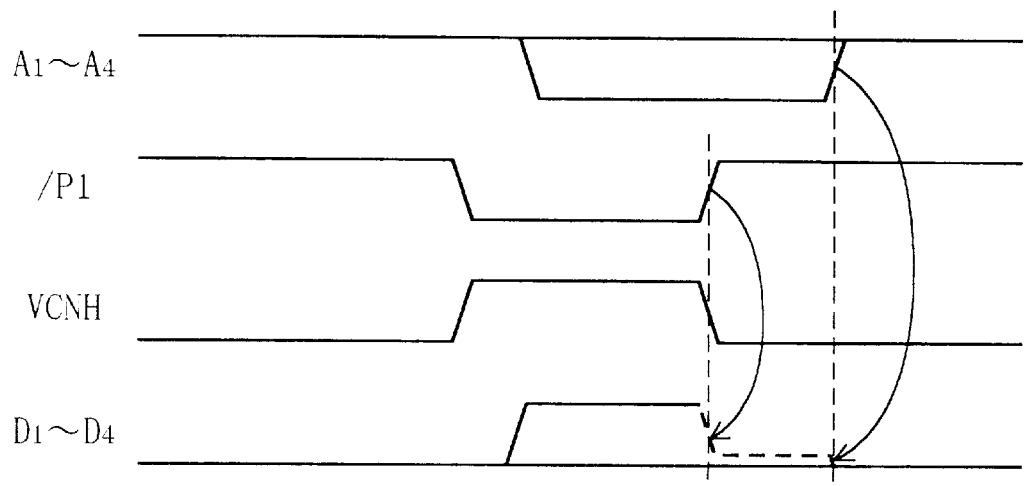

FIG. 9(a) illustrates a fourth modification of the circuit block, which is obtained by further improving the circuit block having the NOR function of the third modification, and illustrates an embodiment of what is claimed in claim 9.

Specifically, in the circuit block of FIG. 9(a), as is obvious from comparison with that shown in FIG. 8(a), the NMOS pull-down transistors 9 of the respective NOR circuits NOR1 through NOR4 are eliminated with a single NMOS transistor 17 interposed between the ground power supply Vss and the merged PMOS transistor 8 having the high threshold voltage. In other words, in this modification, the function of each NOR circuit is realized by the inverter 4 provided to each NOR circuit and including the transistors having a low threshold voltage, the merged PMOS transistor 8 having the high threshold voltage and the merged single NMOS transistor 17. As is shown in FIG. 9(a), the merged PMOS transistor 8 having the high threshold voltage and the merged single NMOS transistor 17 together work as an inverter for controlling a potential of the virtual power line VCNH.

Fifth Modification of Circuit Block

Figure 10A:
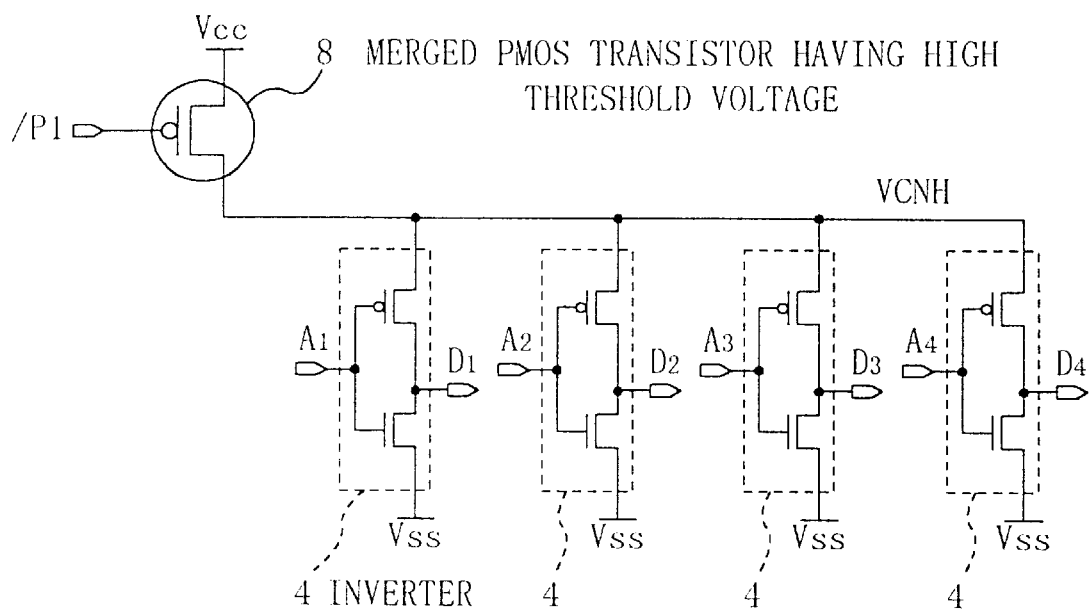
FIG. 10(a) is a diagram for showing a fifth modification of the circuit block and FIG. 10(b) is a diagram for showing an operation waveform of the circuit block of FIG. 10(a)
Figure 10B:
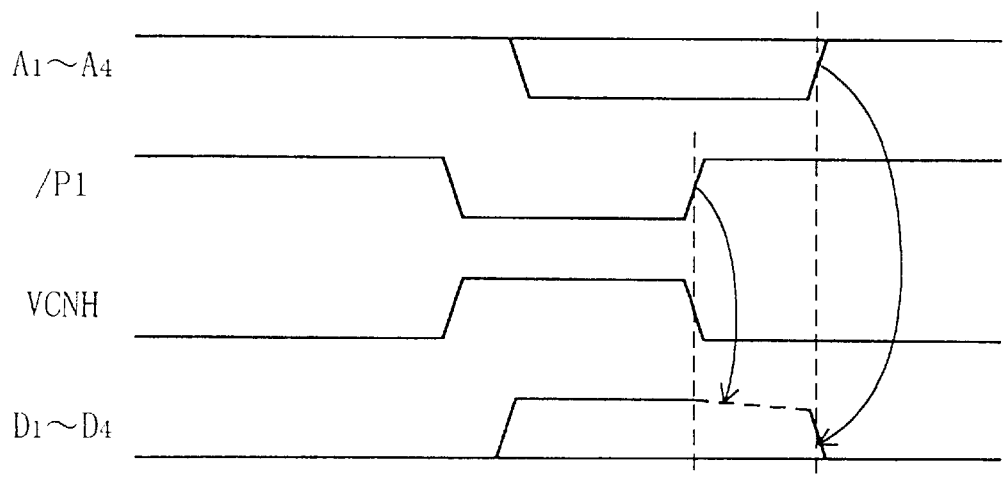

FIG. 10(a) illustrates a fifth modification of the circuit block, which is obtained by further improving the circuit block of the fourth modification, and illustrates an embodiment of what is claimed in claim 10.

Specifically, in the circuit block of FIG. 10(a), as is obvious from comparison with that shown in FIG. 9(a), the merged single NMOS transistor 17 is eliminated. In other words, in this modification, the function of each NOR circuit is realized by the inverter 4 provided to each NOR circuit and including the transistors having a low threshold voltage, and the merged PMOS transistor 8 having the high threshold voltage.

Sixth Modification of Circuit Block

The above description has been made on the case where the circuit block includes the two-input NAND or NOR circuits, but the invention is applicable to a circuit having three or more inputs. In this modification, application to a three-input NAND circuit will be described.

Figure 11:
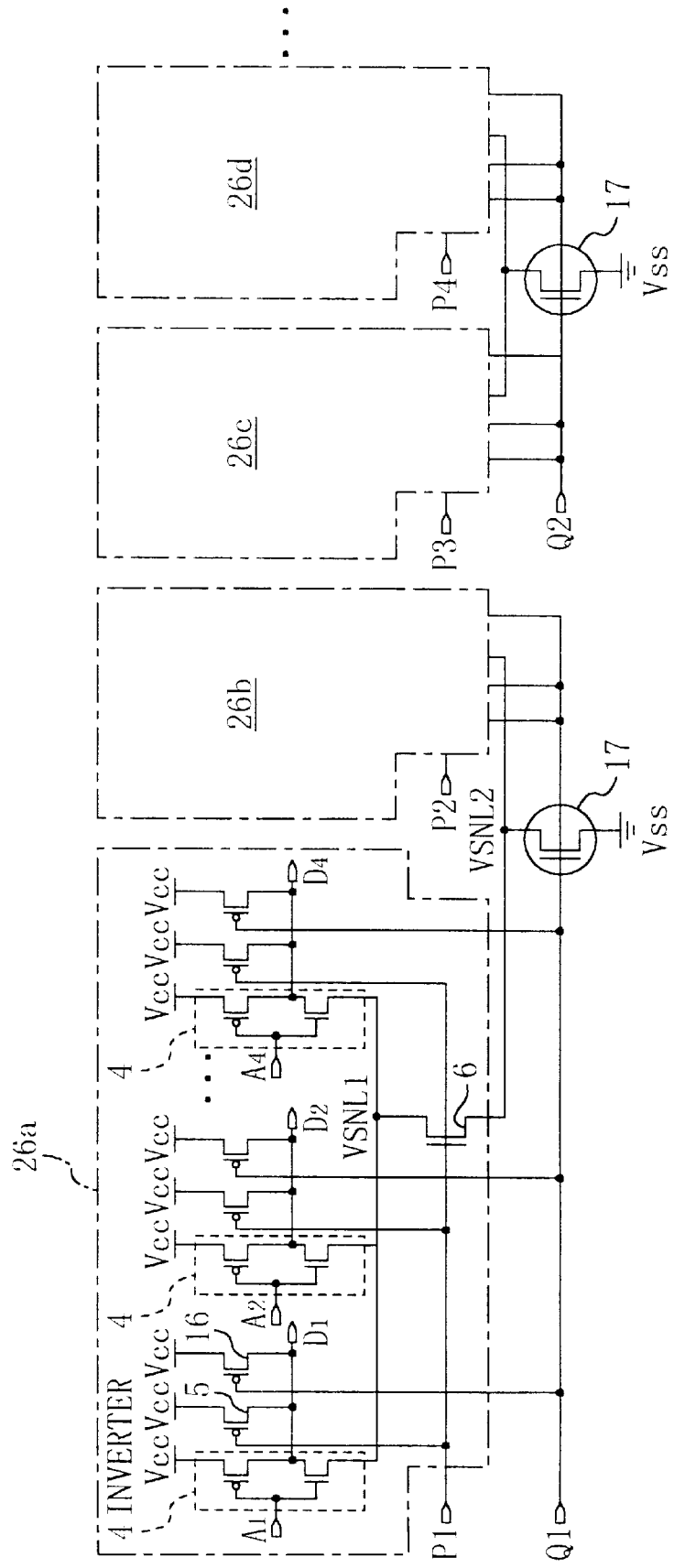
FIG. 11 is a diagram for showing a sixth modification of the circuit block.

In FIG. 11, reference numerals 26a through 26h denote circuit blocks, and the circuit blocks 26a through 26h have the same configuration which is substantially the same as that shown in FIG. 2(a). The entire circuit has a hierarchical configuration, in which two circuit blocks 26a and 26b together form a large block and another two circuit blocks 26c and 26d together form another large block. Each of the circuit blocks of FIG. 11 is different from that of FIG. 2(a) in the output node of each inverter 4 being connected with a pull-up PMOS transistor 16 controlled in accordance with a large block selecting signal Q1 or Q2. A first virtual ground line VSNL1 of each circuit block is connected with a second virtual ground line VSNL2 through an NMOS transistor 6 having a high threshold voltage, and the second virtual ground line VSNL2 is grounded through an NMOS transistor 17 having a high threshold voltage and controlled in accordance with the large block selecting signal Q1 or Q2.

In selecting one large block, one of the large block selecting signals (for example, the signal Q1) undergoes a low to high transition, so as to turn on the NMOS transistor 17 and charge the second virtual ground line VSNL2 with the ground potential Vss. Subsequently, when one block selecting signal (for example, a signal P1) undergoes a low to high transition so as to select one circuit block 26a, the transistor 6 is turned on in this selected circuit block 26a and the first virtual ground line VSNL1 is connected with the second virtual ground line VSNL2, and the ground potential Vss charged in the second virtual ground line VSNL2 is transferred to the first virtual ground line VSNL1.

Ultimately, when the address signals A1 through A4 are input, in the unselected large block, the output of each inverter 4 is retained at a high level even when any of the address signals A1 through A4 undergoes a low to high transition because the pull-up transistor 16 is in an on-state. Furthermore, in the selected large circuit block, the pull-up transistor 16 is turned off, but in the unselected circuit block 26b, the first virtual ground line VSNL1 is in a high impedance state even under application of the ground potential Vss to the second virtual ground line VSNL2 because the transistor 6 is in an off-state. Al so, since the pull-up transistors 5 are in an on-state, the output nodes D1 through D4 of the respective inverters are retained at a high level even when any of the address signals A1 through A4 undergoes a low to high transition. On the other hand, in the selected circuit block 26a, since the ground potential Vss is applied to the first virtual ground line VSNL1 and both the pull-up transistors 5 and 16 are in an off-state, when one of the address signals A1 through A4 undergoes a low to high transition, the corresponding inverter 4 outputs a low output.

In this modification, each of the three-input NAND circuits includes the inverter 4 provided to each NAND circuit, the NMOS transistor 6 having the high threshold voltage and merged among the NAND circuits in one circuit block, and the NMOS transistor 17 having the high threshold voltage and merged among the NAND circuits in one large block. Accordingly, as compared with the case where the NAND circuits do not share the transistors, the gate widths of the merged transistors 6 and 17 can be set at a larger value. As a result, the operation speed can be further increased. It goes without saying that a leakage current during a standby can be suppressed by setting the merged transistor 17, closest to the ground power supply Vss, to have a high threshold voltage and the transistor 6 shared in the circuit block to have a low threshed voltage.

In this manner, when multi-input circuits having at least two inputs are hierarchically disposed, a multi-input decode circuit having a high operation speed and a low leakage current during a standby can be realized.

In the case where the four circuit blocks 26a through 26d of FIG. 11 are to be selected as a large block, the two NMOS transistors 17 having the high threshold voltage shown in FIG. 11 are not grounded but connected with a third virtual ground line (not shown), and this third virtual ground line is connected with the ground power supply Vss through an NMOS transistor having a high threshold voltage (not shown). Furthermore, this newly provided NMOS transistor having the high threshold voltage is supplied, at its gate, with a large block selecting signal (not shown) for simultaneously selecting the four circuit blocks 26a through 26d.

All the aforementioned modifications can be adopted as the inside configuration of each of the minimum circuit blocks 26a through 26d, and needless to say, different modifications can be adopted in different hierarchies.

In summary, the semiconductor integrated circuit of this modification comprises a plurality of circuit blocks each including plural logic circuits which are connected with the first virtual ground line at their nodes, and the NMOS transistor switch for connecting the first virtual ground line with the second virtual ground line and controlled in accordance with a block selecting signal. The plural circuit blocks are hierarchically connected through the second virtual ground line, and between two adjacent hierarchies is disposed the NMOS transistor switch for connecting these adjacent hierarchies and controlled in accordance with a block selecting signal of the upper hierarchy. Among the NMOS transistor switches disposed between the adjacent hierarchies, the NMOS transistor switch of the uppermost hierarchy is connected with the ground line, and at least the NMOS transistor switch of the uppermost hierarchy has a threshold voltage set higher than that of an NMOS transistor included in the plural logic circuits of each circuit block.

In the aforementioned case, each of the plural logic circuits can be constituted by an inverter or a NAND circuit.

Furthermore, time at which all of the block selecting signal and block selecting signals of the respective hierarchies undergo a low to high transition is set to be earlier than time at which all signals input to the plural logic circuits of each circuit block undergo a low to high transition.

Also, this modification is described by exemplifying the circuit blocks 26a through 26d including the NAND circuits as is shown in FIG. 11, but this modification is applicable to circuit blocks where the NAND circuits are replaced with NOR circuits by simply reversing the conductivity types of the transistors and the direction of applying the voltages. Specifically, in the application to the circuit blocks including the NOR circuits, the semiconductor integrated circuit comprises a plurality of circuit blocks each including plural logic circuits which are connected with a first virtual power line at their nodes, and a PMOS transistor switch for connecting the first virtual power line with a second virtual power line and controlled in accordance with a block selecting signal. The plural circuit blocks are hierarchically connected through the second virtual power line, and between two adjacent hierarchies is disposed a PMOS transistor switch for connecting these adjacent hierarchies and controlled in accordance with a block selecting signal of the upper hierarchy. Among the PMOS transistor switches disposed between the adjacent hierarchies, the PMOS transistor switch of the uppermost hierarchy is connected with a power line, and at least the PMOS transistor switch of the uppermost hierarchy has a threshold voltage with an absolute value larger than that of a PMOS transistor included in the plural logic circuits of each circuit block.

In such a case, each of the plural logic circuits can be constituted by an inverter or a NOR circuit.

Furthermore, time at which all of the block selecting signal and block selecting signals of the respective hierarchies undergo a high to low transition is set to be earlier than time at which all signals input to the plural inverters or NAND circuits of each circuit block undergo a high to low transition.

First Modification of Predecoder

Figure 12:
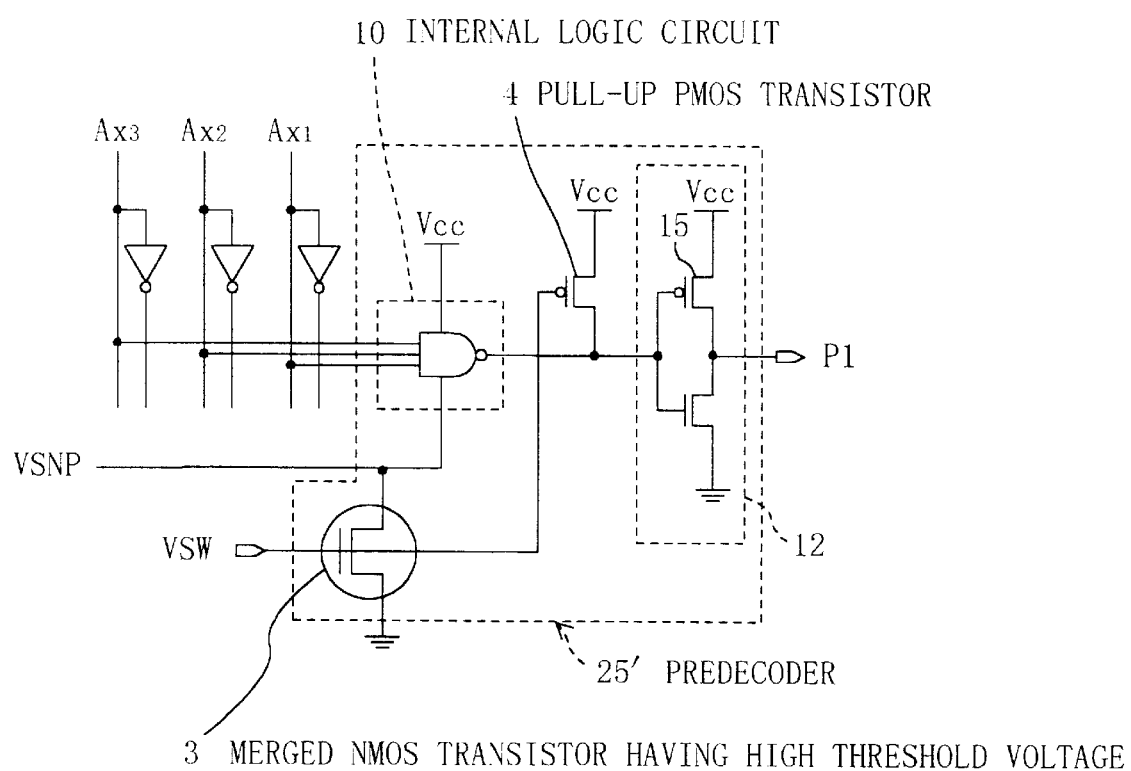
FIG. 12 is a diagram for showing a first modification of the predecoder of FIG. 3.

A first modification of the predecoder 25 is shown in FIG. 12. A predecoder 25' of this modification, corresponding to an embodiment of what is claimed in claim 13, is a circuit for outputting the block selecting signal P1 at a low level during a standby, similarly to the predecoder 25 of FIG. 3. In the predecoder 25', an NMOS transistor 3 works as a transistor having a high threshold voltage for suppressing a leakage current of the internal logic circuit 10 during a standby, and the NMOS transistor 3 is interposed between the internal logic circuit 10 and the ground. The NMOS transistor 3 having the high threshold voltage is controlled in accordance with the operation/standby switching signal (control signal) VSW which is at a low level during a standby. Furthermore, in stead of the pull-down NMOS transistor 11 of FIG. 3, a pull-up PMOS transistor 14 controlled in accordance with the operation/standby switching signal VSW is used.

Next, the operation of the predecoder 25' of this modification will be described. During a standby, the internal logic circuit 10 outputs a high output, and this high output is inverted by the drive circuit 12, so as to output the block selecting signal P1 at a low level. On the other hand, the operation/standby switching signal VSW undergoes a high to low transition, so as to turn off the NMOS transistor 3 and disconnect the ground line VSNP from the ground. Thus, a leakage current from the internal logic circuit 10 to the ground can be cut off. At this point, the ground line VSNP is placed in a floating state, and even when the output of the internal logic circuit 10 is varied because of the potential of the ground line VSNP increased by a leakage current from the predetermined power supply Vcc to the internal logic circuit 10, the input node of the drive circuit 12 is fixed at the predetermined potential Vcc because the pull-up PMOS transistor 14 is an on-state. Thus, the block selecting signal P1 output from the drive circuit 12 can be fixed at a low level.

The pull-up PMOS transistor 14 is connected with the input node of the drive circuit 12 for the following reason: The pull-down NMOS transistor 11 of FIG. 3 can be connected with the output node of the drive circuit 12, but since the operation/standby switching signal VSW for controlling the transistor 3 having the high threshold voltage is at a low level during a standby, another circuit for inverting the switching signal VSW is additionally required for controlling the pull-down NMOS transistor 11. Therefore, the pull-up PMOS transistor 14 is thus connected for omitting this additional circuit.

Furthermore, since the block selecting signal P1 is fixed at a low level by the drive circuit 12 alone, the drive circuit 12 is independent of the internal logic circuit 10 and can be directly grounded at its node with a lower potential. Accordingly, the drive circuit 12 keeps on outputting a low output during a standby. However, in the case where a leakage current of the drive circuit 12 cannot be negligible during a standby, the leakage current can be decreased by using a transistor having a high threshold voltage as a PMOS transistor 15 included in the drive circuit 12.

In addition, when the transistor having a high threshold voltage is used as the PMOS transistor 15 included in the drive circuit 12, a rise speed of the block selecting signal P1 during an operation can be degraded. However, in the first embodiment, the block selecting signal P1 is used merely as a setup signal and does not work as an actuation trigger, and therefore, the slight degradation in the rise speed is negligible.

Moreover, in the case where the speed degradation of the drive circuit 12 cannot be negligible, a transistor having a low threshold voltage is used as the PMOS transistor 15, and another PMOS transistor having a high threshold voltage is interposed between the PMOS transistor 15 and the predetermined power supply Vcc, so that the PMOS transistor having the high threshold voltage can be controlled to be in an off-state during a standby. Thus, a high speed operation and a low leakage current of the drive circuit 12 can be both attained.

Second Modification of Predecoder

Figure 13:
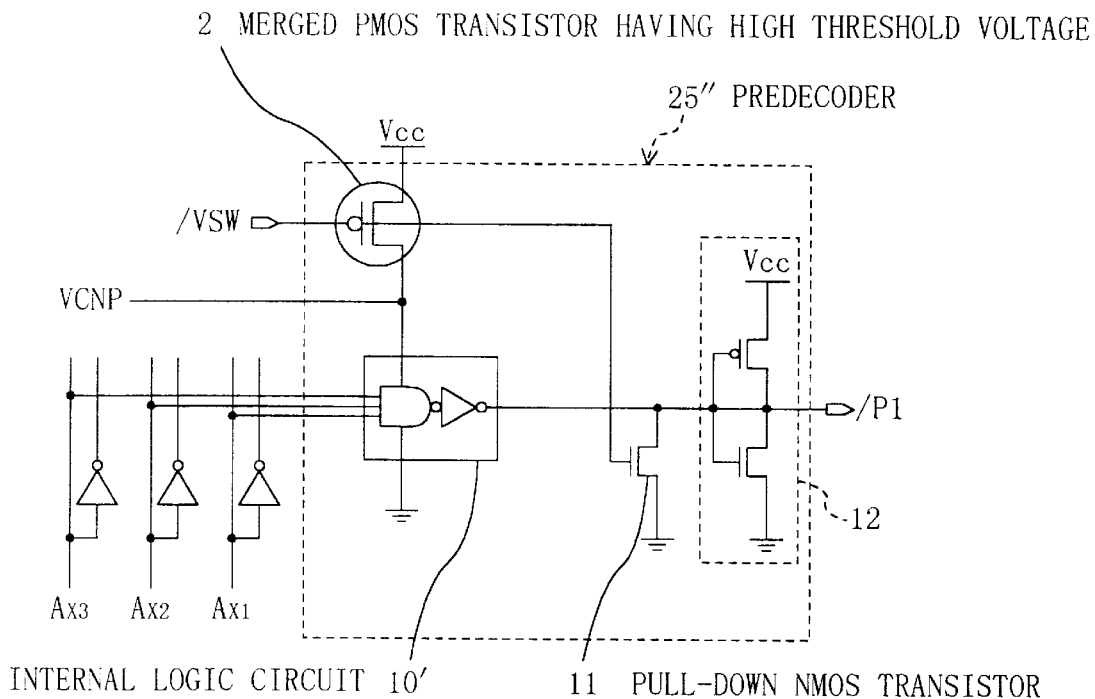
FIG. 13 is a diagram for showing a second modification of the predecoder.

A second modification of the predecoder 25 is shown in FIG. 13. A predecoder 25" of this modification, corresponding to an embodiment of what is claimed in claim 14, is a circuit for outputting a block selecting signal /P1 at a high level during a standby. The predecoder 25" of FIG. 13 has substantially the same configuration as the predecoder 25 of FIG. 3, but different in the following points: The output of an internal logic circuit 10' during a standby has a potential obtained by inverting the output of the internal logic circuit 10 of FIG. 3, namely, is at a low level; and the pull-down NMOS transistor 11 is changed to be interposed between the internal logic circuit 10' and the drive circuit 12. However, the drive circuit 12 keeps on outputting the block selecting signal /P1 at a high potential of the predetermined power supply Vcc during a standby, and therefore, the drive circuit 12 is directly connected with the predetermined power supply Vcc.

In the case where a leakage current due to an NMOS transistor included in the drive circuit 12 cannot be negligible, a transistor having a high threshold voltage is used as the NMOS transistor. When the NMOS transistor does not have a high threshold voltage, another NMOS transistor having a high threshold voltage can be interposed as a switch between the drive circuit 12 and the ground.

Third Modification of Predecoder

Figure 14:
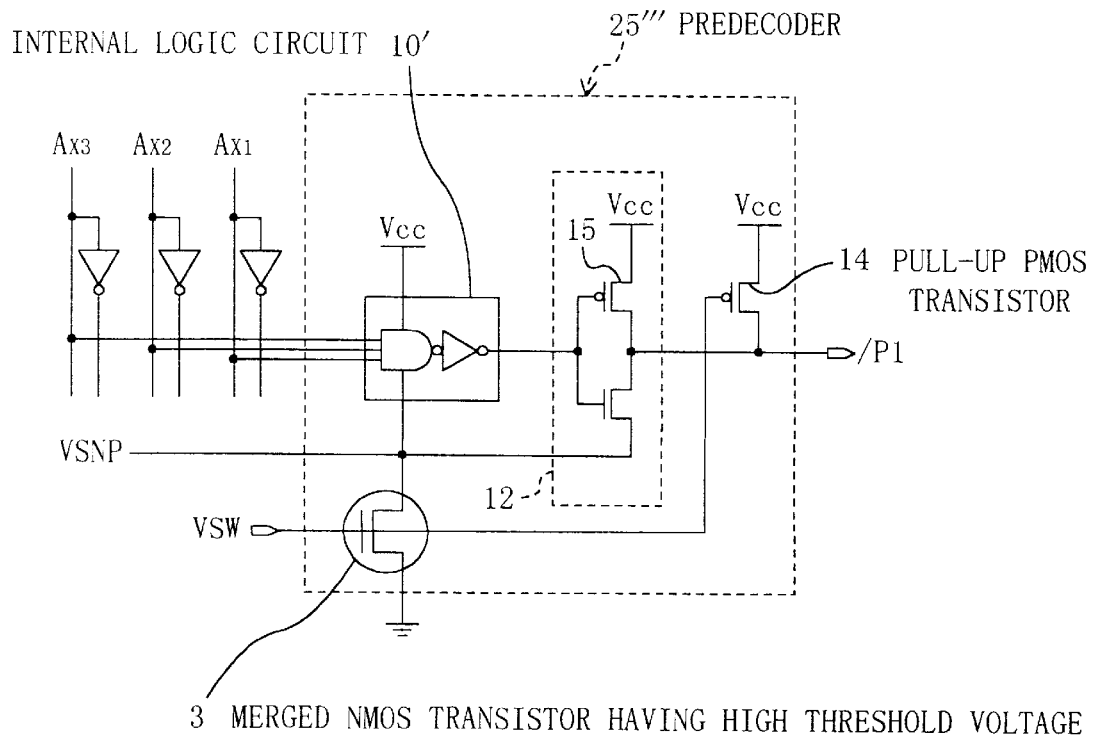
FIG. 14 is a diagram for showing a third modification of the predecoder.

A third modification of the predecoder 25 is shown in FIG. 14. A predecoder 25''' of this modification, corresponding to an embodiment of what is claimed in claim 15, is a circuit for outputting a block selecting signal /P1 at a high level during a standby, similarly to the second modification. The predecoder 25''' of FIG. 14 has substantially the same configuration as that of FIG. 12, but is different in the following points: The output of the internal logic circuit 10' during a standby has a potential obtained by inverting the output of the internal logic circuit 10 of FIG. 3, namely, is at a low level; and the pull-up PMOS transistor 14 is changed to be connected with the output node of the drive circuit 12. In this case, the node with a lower potential of the drive circuit 12 is connected with the ground line VSNP of the internal logic circuit 10', and a transistor having a low threshold voltage is used as a PMOS transistor 15 of the drive circuit 12.

In the case where transistors having a high threshold voltage are connected to the both nodes connected with the predetermined power supply Vcc and the ground so as to disconnect the internal logic circuit from the predetermined power supply Vcc and the ground power supply Vss, a signal /VSW at a high level during a standby and a signal VSW at a low level during a standby are both supplied. Therefore, the pull-up and pull-down transistors can be directly connected with the output node of the drive circuit 12.

What is claimed is:

1. A semiconductor integrated circuit comprising a circuit block including:
   plural logic circuits each having the same configuration and including plural transistors; and
   a switching circuit for connecting said plural logic circuits with a predetermined power supply,
   wherein said switching circuit includes a single merged transistor formed by merging a part of transistors having the same function of said plural logic circuits, and
   said merged transistor of said switching circuit has a threshold voltage higher than a threshold voltage of another transistor included in each of said logic circuits, and receives, at a gate thereof, a block selecting signal for selecting said circuit block.

2. A semiconductor integrated circuit comprising plural circuit blocks each including:
   plural logic circuits each having the same configuration and including plural transistors; and
   a switching circuit for connecting said plural logic circuits with a predetermined power supply,
   wherein said switching circuit includes a single merged transistor formed by merging a part of transistors having the same function of said plural logic circuits, and
   said merged transistor of said switching circuit has a threshold voltage higher than a threshold voltage of another transistor included in each of said logic circuits, and receives, at a gate thereof, a block selecting signal for selecting one of said circuit blocks.

3. The semiconductor integrated circuit of any of claims 1 and 2,
   wherein each of said logic circuits is a NAND circuit or a NOR circuit.

4. The semiconductor integrated circuit of any of claims 1 and 2,
   wherein an input order of signals input to said plural logic circuits and said block selecting signal input to said gate of said merged transistor of said switching circuit is previously determined, and said block selecting signal is input precedently to said signals to said plural logic circuits.

5. The semiconductor integrated circuit of any of claims 1 and 2,
   wherein said plural logic circuits are NAND circuits,
   each of said NAND circuits includes:
      an inverter;
      a merged NMOS transistor interposed between a ground node of said inverter and a ground power supply and merged among said NAND circuits; and
      a pull-up PMOS transistor interposed between a power supply and an output node of said inverter, and
   said merged NMOS transistor and said pull-up PMOS transistor are controlled in accordance with said block selecting signal.

6. The semiconductor integrated circuit of any of claims 1 and 2,
   wherein said plural logic circuits are NAND circuits,
   each of said NAND circuits includes:
      an inverter;
      a merged NMOS transistor interposed between a ground node of said inverter and a ground power supply and merged among said NAND circuits; and
      a pull-up PMOS transistor interposed between a power supply and said ground node of said inverter and merged among said NAND circuits, and
   said merged NMOS transistor and said pull-up PMOS transistor are controlled in accordance with said block selecting signal.

7. The semiconductor integrated circuit of any of claims 1 and 2,
   wherein said plural logic circuits are NAND circuits,
   each of said NAND circuits includes:
      an inverter; and
      a merged NMOS transistor interposed between a ground node of said inverter and a ground power supply and merged among said NAND circuits, and
   said merged NMOS transistor is controlled in accordance with said block selecting signal.

8. The semiconductor integrated circuit of any of claims 1 and 2,
   wherein said plural logic circuits are NOR circuits,
   each of said NOR circuits includes:
      an inverter;
      a merged PMOS transistor interposed between a power node of said inverter and a predetermined power supply and merged among said NOR circuits; and
      a pull-down NMOS transistor interposed between a ground power supply and an output node of said inverter, and
   said merged PMOS transistor and said pull-down NMOS transistor are controlled in accordance with said block selecting signal.

9. The semiconductor integrated circuit of any of claims 1 and 2,
   wherein said plural logic circuits are NOR circuits,
   each of said NOR circuits includes:
      an inverter;
      a merged PMOS transistor interposed between a power node of said inverter and a predetermined power supply and merged among said NOR circuits; and
      a pull-down NMOS transistor interposed between a ground power supply and said merged PMOS transistor and merged among said NOR circuits, and
   said merged PMOS transistor and said pull-down NMOS transistor are controlled in accordance with said block selecting signal.

10. The semiconductor integrated circuit of any of claims 1 and 2, wherein said plural logic circuits are NOR circuits,
each of said NOR circuits includes:
  an inverter; and
  a merged PMOS transistor interposed between a power node of said inverter and a predetermined power supply and merged among said NOR circuits, and
said merged PMOS transistor is controlled in accordance with said block selecting signal.

11. A decode circuit for a memory comprising:
a predecoder for predecoding a part of address signals of plural bits and outputting a predecoded signal as a block selecting signal; and
plural circuit blocks to be selected in accordance with said block selecting signal of said predecoder,
wherein each of said circuit blocks includes:
  plural logic circuits, each having the same configuration and including plural transistors, for decoding remaining address signals which are not predecoded by said predecoder when said circuit block is selected; and
  a switching circuit for connecting said plural logic circuits with a predetermined power supply,
said switching circuit includes a single merged transistor formed by merging transistors having the same function of said plural logic circuits, and
said merged transistor of said switching circuit has a threshold voltage higher than a threshold voltage of another transistor included in each of said logic circuits and receives, at a gate thereof, said block selecting signal of said predecoder.

12. The decode circuit of claim 11,
wherein said predecoder includes:
  an internal logic circuit, including merely a transistor having a low threshold voltage and outputting a high output during a standby, for receiving said part of said address signals;
  a drive circuit, including an inverter consisting of merely transistors having a low threshold voltage and outputting a high output during a standby, for receiving an output of said internal logic circuit and outputting an inverted signal of an output of said inverter as said block selecting signal from an output node thereof;
  a power line with which said internal logic circuit and said drive circuit are connected;
  a PMOS transistor having a high threshold voltage interposed between said power line and a predetermined power supply and controlled to be in an off-state during a standby in accordance with a control signal; and
  a pull-down NMOS transistor interposed between said output node of said drive circuit and a ground line and controlled to be in an on-state during a standby in accordance with said control signal.

13. The decode circuit of claim 11,
wherein said predecoder includes:
  an internal logic circuit, including merely transistors having a low threshold voltage and outputting a high output during a standby, for receiving said part of said address signals;
  a drive circuit including an inverter outputting a low output during a standby for receiving an output of said internal logic circuit and outputting an inverted signal of an output of said inverter as said block selecting signal from an output node thereof;
  a ground line with which said internal logic circuit is connected;
  an NMOS transistor having a high threshold voltage interposed between said ground line and a ground and controlled to be in an off-state during a standby in accordance with a control signal; and
  a pull-up PMOS transistor interposed between an output node of said internal logic circuit and a predetermined power supply and controlled to be in an on-state during a standby in accordance with said control signal.

14. The decode circuit of claim 11,
wherein said predecoder includes:
  an internal logic circuit, including merely transistors having a low threshold voltage and outputting a low output during a standby, for receiving said part of said address signals;
  a drive circuit including an inverter outputting a high output during a standby for receiving an output of said internal logic circuit and outputting an inverted signal of an output of said inverter as said block selecting signal from an output node thereof;
  a power line with which said internal logic circuit is connected;
  a PMOS transistor having a high threshold voltage interposed between said power line and a predetermined power supply and controlled to be in an off-state during a standby in accordance with a control signal; and
  a pull-down NMOS transistor interposed between an output node of said internal logic circuit and a ground and controlled to be in an on-state during a standby in accordance with said control signal.

15. The decode circuit of claim 11,
wherein said predecoder includes:
  an internal logic circuit, including merely transistors having a low threshold voltage and outputting a low output during a standby, for receiving said part of said address signals;
  a drive circuit including an inverter consisting of merely transistors having a low threshold voltage and outputting a high output during a standby, for receiving an output of said internal logic circuit and outputting an inverted signal of an output of said inverter as said block selecting signal from an output node thereof;
  a ground line with which said internal logic circuit and said drive circuit are connected;
  an NMOS transistor having a high threshold voltage interposed between said ground line and a ground and controlled to be in an off-state during a standby in accordance with a control signal; and
  a pull-up PMOS transistor interposed between said output node of said drive circuit and a predetermined power supply and controlled to be in an on-state during a standby in accordance with said control signal.

* * * * *